(12) United States Patent
Vukovic et al.

(10) Patent No.: US 12,007,689 B2
(45) Date of Patent: Jun. 11, 2024

(54) APPARATUS AND METHOD FOR SPIN PROCESSING

(71) Applicant: Tokyo Electron Limited, Tokyo (JP)

(72) Inventors: Mirko Vukovic, Slingerlands, NY (US); Steven Gueci, Gansevoort, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/661,901

(22) Filed: May 3, 2022

(65) Prior Publication Data

US 2023/0004088 A1  Jan. 5, 2023

Related U.S. Application Data (60) Provisional application No. 63/217,349, filed on Jul. 1, 2021.

(51) Int. Cl.
*G03F 7/16* (2006.01)
*H01L 21/027* (2006.01)
*H01L 21/033* (2006.01)

(52) U.S. Cl.
CPC .......... *G03F 7/162* (2013.01); *H01L 21/0271* (2013.01); *H01L 21/0337* (2013.01)

(58) Field of Classification Search
CPC ..... G03F 7/162; G03F 7/168; H01L 21/0271; H01L 21/0337; H01L 21/02118; H01L 21/02282; H01L 21/67051; H01L 21/6715
See application file for complete search history.

(56) References Cited

U.S. PATENT DOCUMENTS

| | | | |
|---|---|---|---|
| 7,752,999 B2 * | 7/2010 | Nakashima | H01L 21/6715 118/712 |
| 8,236,378 B2 | 8/2012 | Nakashima et al. | |
| 8,657,963 B2 | 2/2014 | Yeh et al. | |
| 2002/0155648 A1 | 10/2002 | Ashjaee et al. | |
| 2008/0190448 A1 | 8/2008 | Kim et al. | |

(Continued)

OTHER PUBLICATIONS

ACM Research "ACM Research Enters Bevel Etch Market to Support Emerging Process Steps in 3D NAND, DRAM and Advanced Logic Manufacturing," Aug. 5, 2021, https://www.globenewswire.com/news-release/2021/08/05/2276048/0/en/ACM-Research-Enters-Bevel-Etch-Market-to-Support-Emerging-Process-Steps-in-3D-NAND-DRAM-and-Advanced-Logic-Manufacturing.html, 4 pages.

(Continued)

*Primary Examiner* — Alexander M Weddle
(74) *Attorney, Agent, or Firm* — Slater Matsil, LLP (57) ABSTRACT

Equipment for coating a wafer is disclosed, where the equipment includes a wafer holder configured to spin the wafer while holding the wafer; a rotary drive configured to spin the wafer holder; a nozzle configured to pour liquid onto a surface to be coated of the wafer; an annular duct disposed circumferentially around the wafer when the wafer is spun by the wafer holder, the duct configured to collect material ejected off an edge of the wafer; and an air knife disposed proximate a backside, the backside being opposite the side to be coated, where the air knife is configured to blow an air curtain through a slot onto an exposed edge region of the backside at a grazing angle of incidence to flow gas radially outward along the backside toward the annular duct.

20 Claims, 8 Drawing Sheets

(56) References Cited

U.S. PATENT DOCUMENTS

2012/0061345 A1* 3/2012 Utsumi ............ H01L 21/67034
216/13
2018/0151343 A1* 5/2018 Takiguchi ......... H01L 21/67225

OTHER PUBLICATIONS

Atlas Copco, "Low Pressure Air Applications and Blower Technologies," https://www.atlascopco.com/en-au/compressors/blowers, accessed on Mar. 28, 2022, 1 page.
Jekauc, Igor et al., "Necessity of chemical edge bead removal in modern-day lithographic processing," Proceedings vol. 5376, Advances in Resist Technology and Processing XXI; (2004) https://doi.org/10.1117/12.535268, Event: Microlithography 2004, May 14, 2004, Santa Clara, California, United States, 1 page.
Jekauc, Igor et al., "Necessity of Chemical Edge Bead Removal in Modern Day Lithographic Processing," Advances in Resist Technology and Processing XXI, Proceedings of SPIE vol. 5376, May 2004, 9 pages.
Nanja, Pradeep, "Challenges and Solutions for Silicon Wafer Bevel Defects during 3D NAND Flash Manufacturing," CONVENTOR, https://www.coventor.com/blog/silicon-wafer-bevel-defects-during-3d-nand-flash-manufacturing/, May 21, 2019, 4 pages.
Park, Chan Geun et al., "Simultaneous Removal of Particles from Front and Back Sides by a Single Wafer Backside Megasonic System," Solid State Phenomena. vol. 187. Trans Tech Publications Ltd, Apr. 2012, 4 pages.
Paxton Products, "Ionized Air Systems," Ionized Air System Brochure, accessed on Jan. 20, 2022, 2 pages.
Republic Manufacturing, "Air Knife Systems," Air Knife Component Brochure, accessed on Mar. 11, 2022, 8 pages.
Republic Manufacturing, "Air Knife Systems," accessed on Jan. 20, 2022, 6 pages.
Screen Dainippon Screen Mfg. Co., Ltd., "Development of first wafer cleaning equipment with bevel cleaning technology for semiconductor manufacturing industry," Doc. No.: NR060920E, Sep. 20, 2006, 2 pages.
Solvair, "Effective, Energy-Efficient Air Knife Systems, Highly effective cleaning, drying, blow-off and liquid control for a wide range of industrial applications," www.solvair.co.uk, Doc Ref: PRM-SOL-054, accessed Jan. 20, 2022, 2 pages.
Solvair, Engineered Air Solutions, "How Air Knives Work," https://www.solvair.co.uk/resource/how-air-knives-work/, downloaded on Jan. 22, 2022, 11 pages.

* cited by examiner

APPARATUS AND METHOD FOR SPIN PROCESSING

CROSS-REFERENCE TO RELATED APPLICATIONS

This application claims the benefit of U.S. Provisional Application No. 63/217,349, filed on Jul. 1, 2021, which application is hereby incorporated herein by reference.

TECHNICAL FIELD

The present invention relates generally to equipment and methods for processing a semiconductor wafer, and, in particular embodiments, to equipment and methods for spin processing of a semiconductor wafer.

BACKGROUND

An integrated circuit (IC) is a network of electronic components connected by metal lines and vias in a monolithic structure formed by depositing and patterning layers of insulating and conducting materials over a semiconductor wafer. The wafer is processed through a sequence of patterning levels where, at each level, a matrix of identical copies of a pattern is printed on the wafer using photolithography, whereby many ICs are fabricated in one wafer. However, only the fully functional units may be sold as the IC product. Defects caused by particles, voids, cracks etc., reduce the yield of saleable units. Some defects in patterning are traced to edge effects during spin coating resist on top of the wafer. One example is contamination due to resist from the top side encroaching onto the backside of the wafer. The encroachment occurs when the rapidly spinning wafer forces liquid to flow radially beyond the edge and down the sides of the wafer. The technique of spinning a wafer during processing, or spin processing, is used in multiple process modules. In lithography, spin processing is used for centrifugal coating and drying (spin coat and spin-dry) of liquid films, such as resists, organic bottom anti-reflective coating (BARC), and planarizing layers such as spin-on glass (SOG) and spin-on carbon (SOC). Advances in spin processing are desired for enhancing the yield of IC fabrication and reducing the unit cost of ICs.

SUMMARY

Equipment for coating a wafer, where the equipment includes a wafer holder configured to spin the wafer while holding the wafer, a rotary drive configured to spin the wafer holder; a nozzle configured to pour liquid onto a surface to be coated of the wafer; an annular duct disposed circumferentially around the wafer when the wafer is spun by the wafer holder, the duct configured to collect material ejected off an edge of the wafer, and an air knife disposed proximate a backside, the backside being opposite the side to be coated, where the air knife is configured to blow an air curtain through a slot onto an exposed edge region of the backside at a grazing angle of incidence to flow gas radially outward along the backside toward the annular duct.

A method for coating a wafer, where the method includes holding a wafer with a rotatable wafer holder, the wafer having an exposed edge region; through a slot of an air knife, blowing an air curtain onto a backside of the wafer at a grazing angle of incidence to create a radially outward gas-flow away from the wafer, the backside being opposite a surface to be coated; forming a liquid coating on the surface to be coated, the forming including: positioning a nozzle above a central region of the surface to be coated; pouring a liquid from the nozzle onto the surface to be coated; spinning the wafer held by the wafer holder while blowing the air curtain, the air curtain blocking the liquid from encroaching onto the backside; and collecting material ejected off the edge of the wafer in an annular duct disposed circumferentially around the edge, the material including liquid and solid particles dislodged by the spinning and the gas-flow.

A track system including: a wafer coater module including: a wafer holder configured to spin a wafer held such that a surface to be coated and an edge region of a backside are exposed, the backside being opposite the surface to be coated; a rotary drive configured to spin the wafer holder about a central axis normal to the wafer, where spinning the wafer holder spins the wafer held by the wafer holder; a nozzle configured to be positioned above the surface to be coated and pour liquid onto the surface to be coated; an air knife including a plenum having a gas inlet coupled to a gas blower and a slot for an air curtain to exit, the air knife configured to position the slot proximate the backside and tilted to direct the air curtain toward the backside at a grazing angle of incidence to create a gas-flow radially outward along the exposed backside; and an annular duct disposed to be circumferentially around the wafer when spun by the wafer holder, the duct being configured to collect liquid and solid particles dislodged by the spinning and the gas-flow and ejected off an edge of the wafer, and a light source and a camera coupled to a controller to acquire and transmit photographic images of the surfaces of the wafer to an inspection device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In IC fabrication, spin processing is a technique of spinning a semiconductor wafer while processing the wafer through a single-wafer process step. Spin processing has been applied to various semiconductor processes, including spin rinse, spray etch, tilted ion implantation, spin-dry, and spin coating. In addition, the wafer is rotated during some thermal and plasma processes to even out angular non-uniformities in reactant density and temperature profiles across the wafer. This disclosure describes embodiments of equipment and methods for coating a wafer with a liquid film using spin coating, where the equipment includes an air knife that blows an air curtain toward the wafer. Generally, in the spin coating process, the liquid film is formed on a surface to be coated by pouring a controlled amount of liquid onto a central region of the surface and spreading the liquid approximately uniformly across the wafer by spinning the wafer at a high rotational speed about its central axis perpendicular to the wafer surface. Centrifugal forces that result from the spinning push the liquid to flow radially outward across the substantially planar surface. As the liquid flow reaches the edge, some of the excess liquid may be ejected off the edge while some may flow down the sides and encroach onto a backside of the wafer. If not removed, undesired liquid residue along the sides and the backside could be a source of particles and chemical contamination during subsequent processing.

Figure 2A:
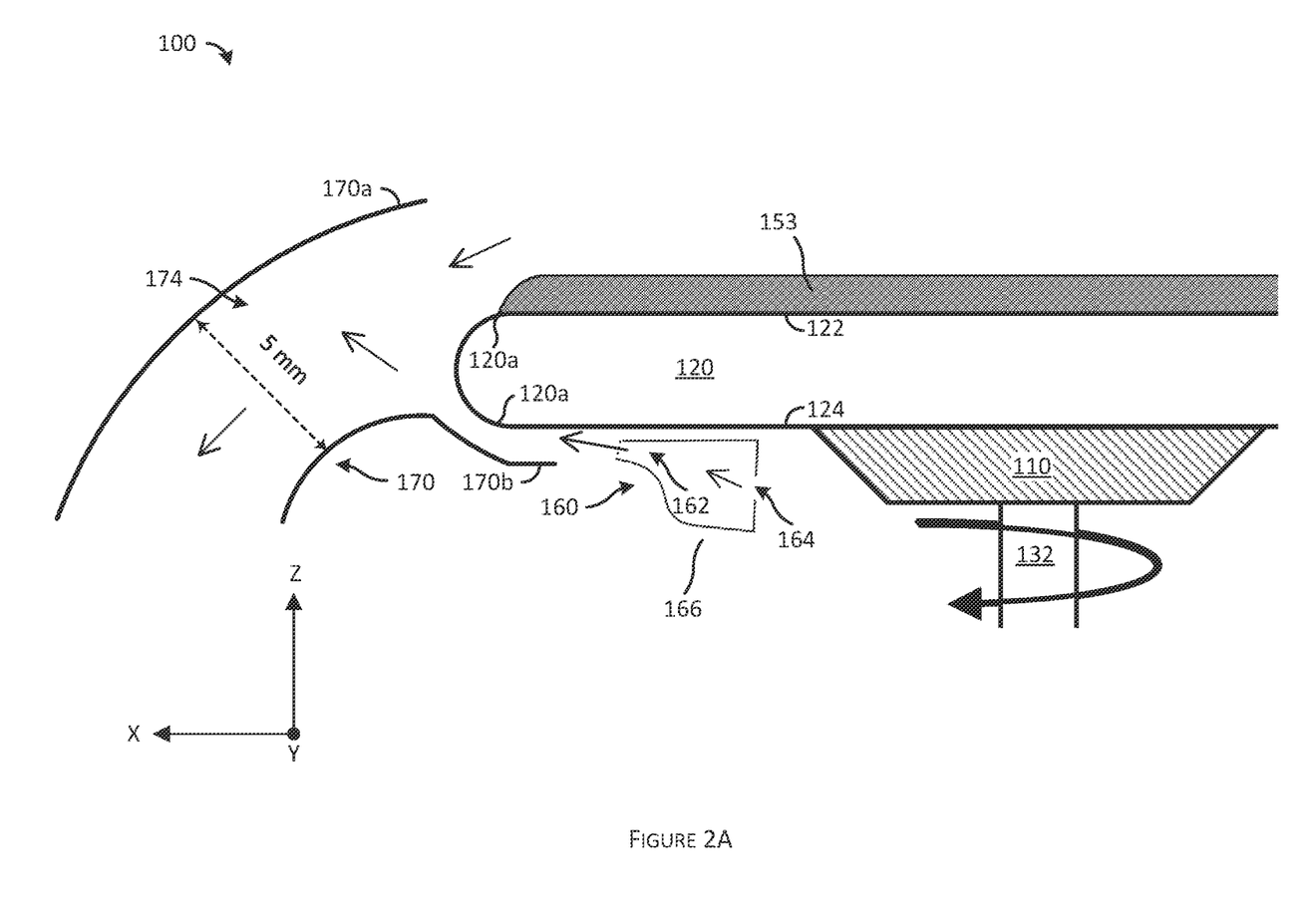
FIG. 2A illustrates a magnified view of the equipment illustrated in FIG. 1.
Figure 3:
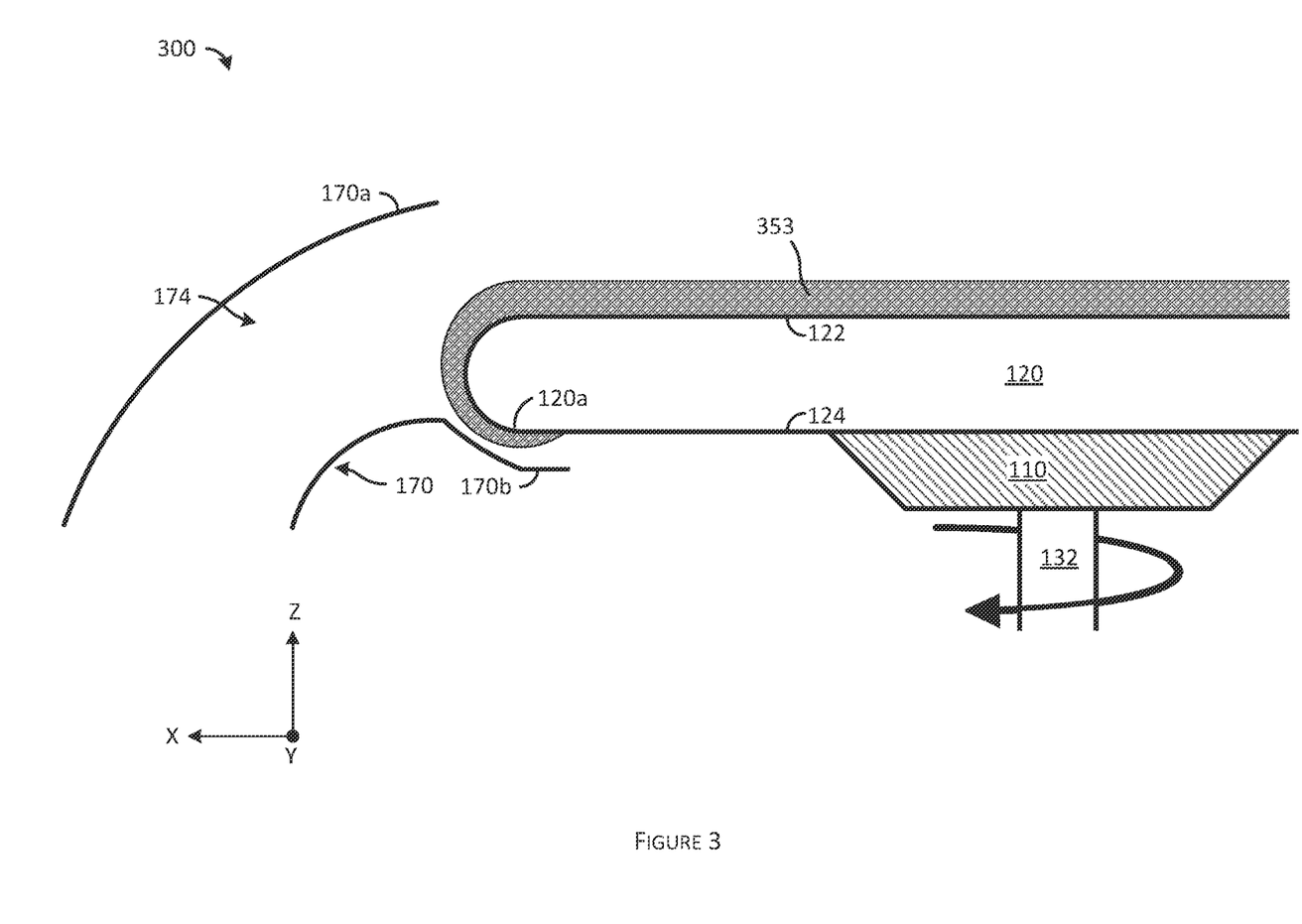
FIG. 3 illustrates the cross-sectional view of the equipment illustrated in FIG. 2A without the air-knife.
Figure 4:
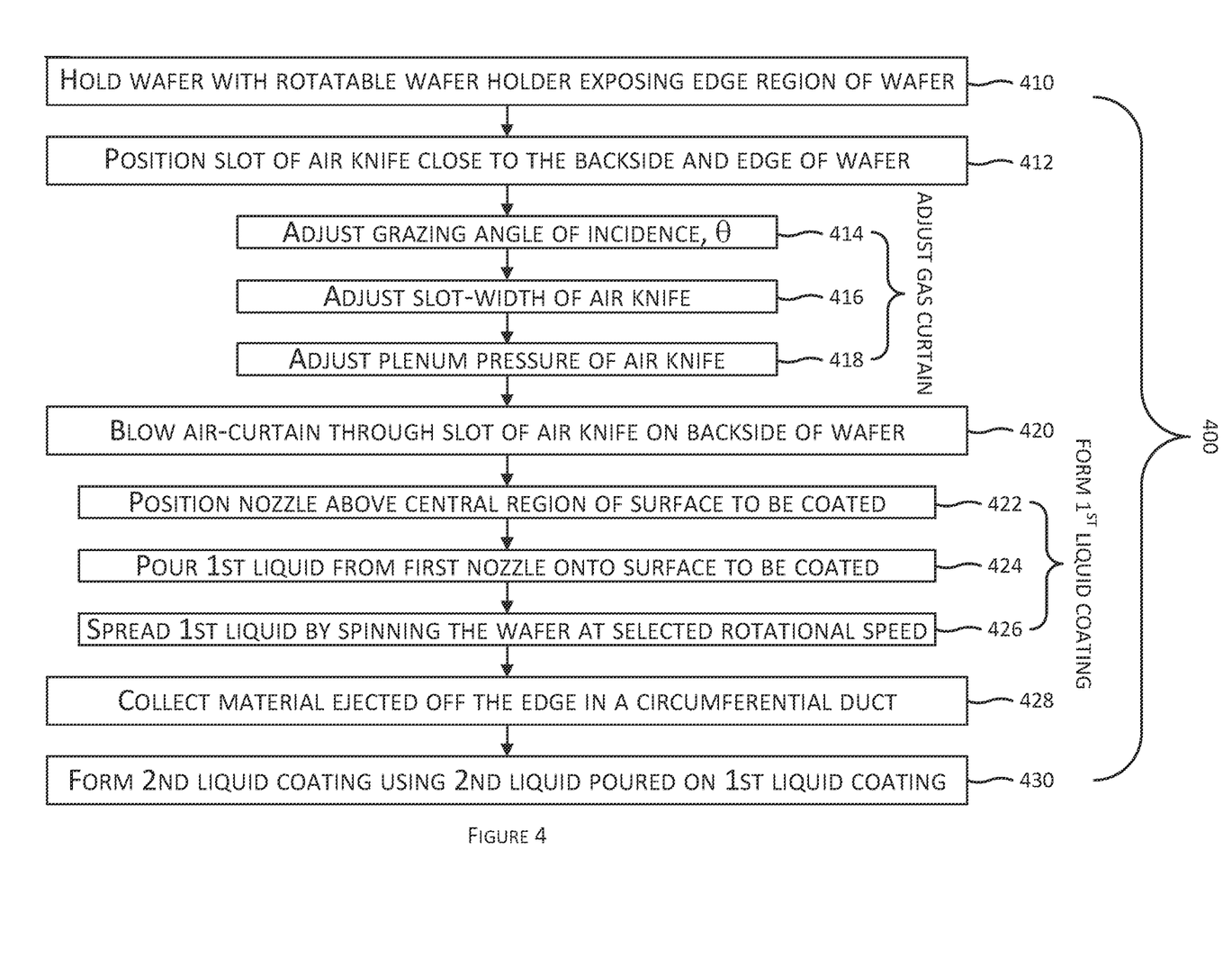
FIG. 4 illustrates a flow diagram of a method for coating a wafer, in accordance with some embodiment.
Figure 5:
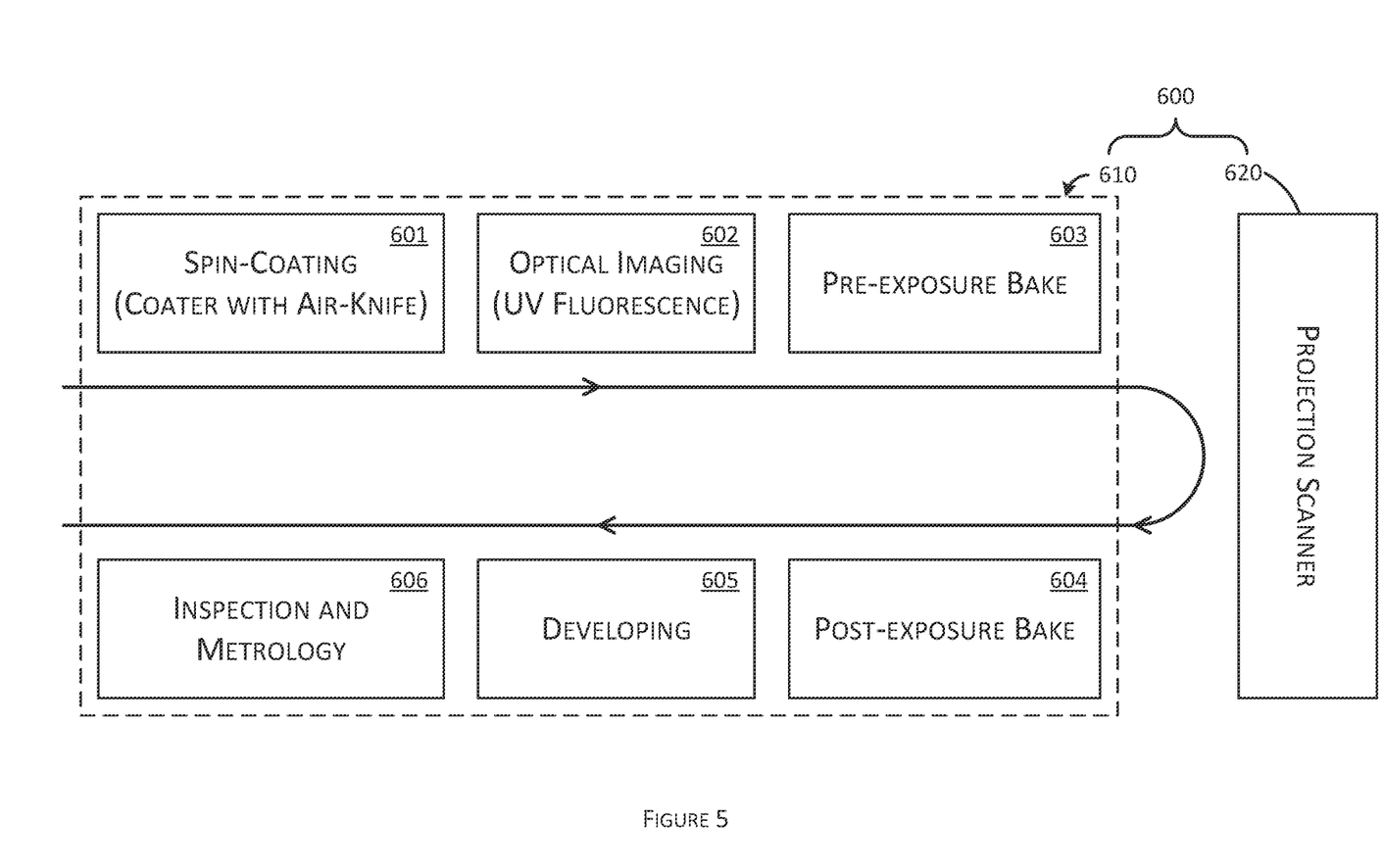
FIG. 5 illustrates a block diagram of a lithography system, in accordance with some embodiment.

In the embodiments described in this disclosure, an air knife is positioned in close proximity of the edge to blow an air curtain toward the backside and create a radially outward gas-flow along the backside and away from the wafer. The gas-flow is designed to block the encroaching liquid from flowing down the sides and confines the liquid film to the top side of the wafer. An example embodiment of equipment for coating a liquid film on a surface to be coated of a semiconductor wafer is described with respect to a cross-sectional view, illustrated in FIG. 1. A magnified view of the region within a dashed rectangle, A, is shown in FIG. 2A. The air knife and associated gas-flow are described with reference to the magnified cross-sectional view in FIG. 2A, a perspective view in FIG. 2B, and another magnified cross-sectional view in FIG. 2C. The view in FIG. 2C illustrates some example values of dimensions related to the gas-flow and a grazing angle of incidence, θ, at which the air curtain is incident on the backside. FIG. 2D illustrates a planar view of another example embodiment, where the air knife is shaped like a ring positioned below an edge region of the wafer. Encroachment of liquid to the backside is shown in FIG. 3, where the liquid film has been formed without utilizing an air curtain. FIG. 4 illustrates a flow diagram of an example embodiment of a method for coating a wafer using the equipment illustrated in FIG. 1. An example method for coating the wafer is described with reference to the flow diagram in FIG. 4. FIG. 5 illustrates a block diagram of a lithography system comprising a track system that incorporates various aspects of the invention.

Figure 1:
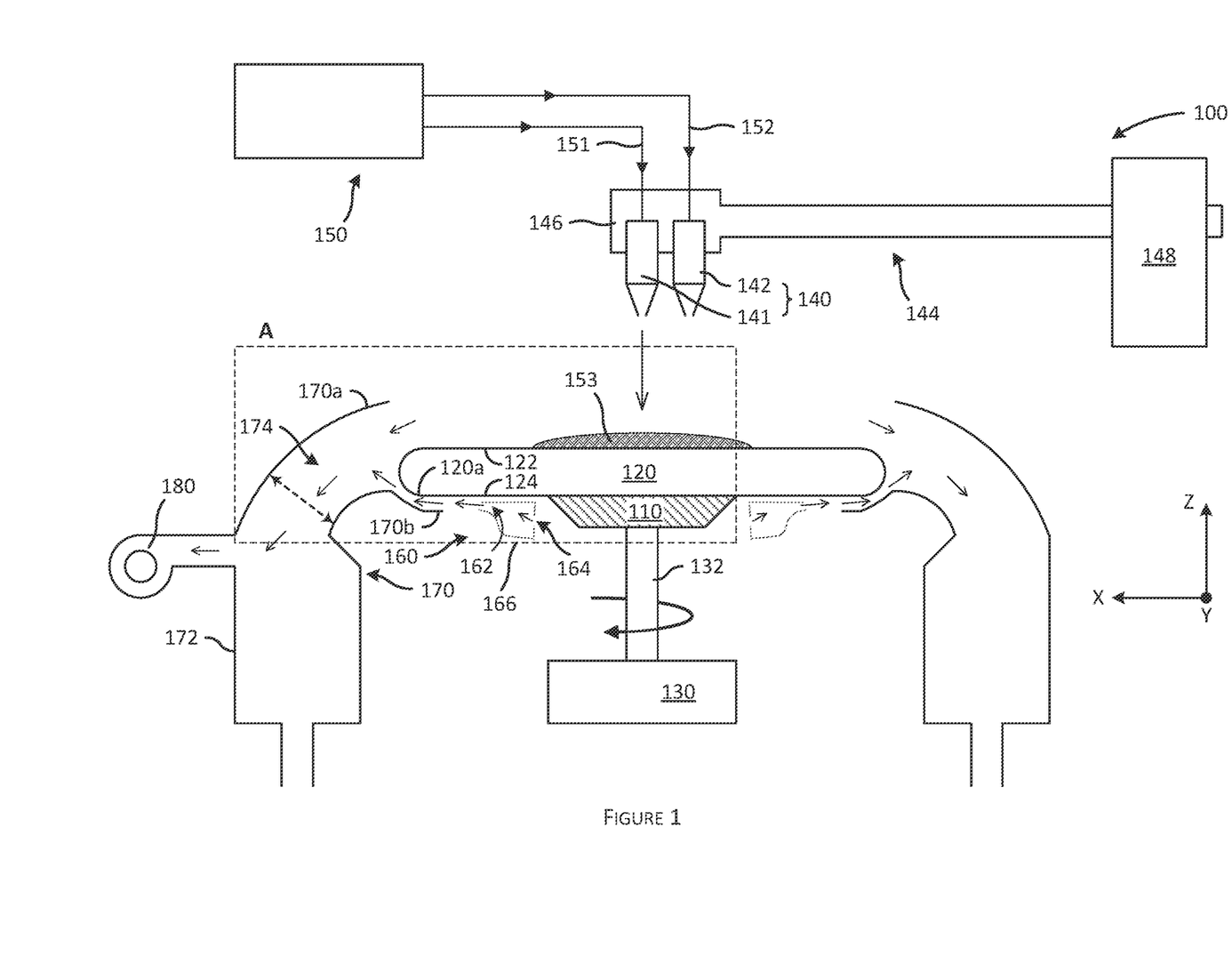
FIG. 1 illustrates a cross-sectional view of equipment for coating a wafer, in accordance with some embodiment.

An example embodiment of equipment for coating a wafer, referred to here as spin-coater 100, is illustrated in a cross-sectional view in FIG. 1. The spin-coater 100 may be housed in a box (not shown) and is coupled to a liquid supply system 150 outside. The liquid supply system 150 is configured to provide various process solutions to the spin-coater 100 through liquid supply lines, such as a first liquid supply line 151 and a second liquid supply line 152, of the liquid supply system 150. Although not shown, the liquid flow in each liquid supply line may be controlled using a supply valve and a suck back valve. The supply valve may be operated to pass or stop liquid selectively from a supply tank of the liquid supply system 150 to the spin-coater 100. The suck back valve is operated when liquid has to be retracted in order to prevent unwanted dripping inside the spin-coater 100. The retraction may be achieved, for example, by inflating a suction chamber of the suck back valve. The valves may be operated by a controller (not shown) that governs the operation of both the liquid supply system 150 and the spin-coater 100 with command signals to synchronously execute the coating process.

The spin-coater 100 has a rotatable wafer holder 110 holding a wafer 120. In the example embodiment in FIG. 1, the wafer holder 110 is a spin chuck holding the backside 124 of the wafer 120. In some other embodiment, a different wafer holder design, for example, clamps contacting a circumference of the wafer 120 may be used. As illustrated in FIG. 1, the wafer holder 110 and the wafer 120 have been aligned to place the wafer 120 concentrically on the wafer holder 110. The concentric placement ensures that spinning the wafer holder 110 spins the wafer 120 about its center along with the wafer holder 110. A rotary drive 130 such as an electric motor may be configured to rotate the wafer holder 110 about its central axis. The rotary drive 130, in this embodiment, is coupled to the wafer holder 110 by a drive shaft 132 disposed along the central axis of the wafer holder 110 and the wafer 120.

As illustrated in FIG. 1, a diameter of the wafer holder 110 is less than a diameter of the wafer 120, thereby exposing both sides of the edge region of the wafer 120, in addition to exposing the entire top side (the side opposite the backside 124). The top side is the surface to be coated 122. A movable nozzle arm 144 comprising a nozzle holder 146 holding a nozzle 140 is seen disposed above the wafer 120. Here, nozzle, such as nozzle 140, refers to any number of individual pouring nozzles held in one nozzle holder. In this example, the nozzle 140 comprises two pouring nozzles, a first nozzle 141 and a second nozzle 142, each shaped like a tube with a tapered tip and a base attached to the nozzle holder 146. In FIG. 1, the nozzle holder 146 has been positioned at a pouring location above a central region of the surface to be coated 122 by sliding the nozzle arm 144 along a rail 148. The first nozzle 141 is coupled to the first liquid supply line 151 supplying the first liquid, and the second nozzle 142 is coupled to the second liquid supply line 152 supplying the second liquid, as illustrated schematically in FIG. 1. The second liquid may be different from the first liquid.

The spin coating process in the example embodiment is for forming a liquid coating that is a composite of the first liquid and the second liquid. The composite coating is formed by first coating the surface to be coated 122 with the first liquid. After forming the first liquid coating, the second liquid is poured through the second nozzle 142 on the first liquid coating and spread over the surface to be coated 122 to form a second liquid coating, which is the final composite coating. Generally, each liquid is supplied through a dedicated supply line to a dedicated individual pouring nozzle. Accordingly, in an embodiment where the nozzle holder is not configured to hold several individual nozzles, a nozzle changing operation may have to be performed prior to pouring the second liquid. By using nozzle holder 146 holding the first nozzle 141 and the second nozzle 142, the nozzle changing operation may be eliminated from the spin coating process for this embodiment.

It is common practice to pour a process solution, such as the first liquid and the second liquid, while the wafer (e.g., wafer 120) is spun at a relatively low speed. However, in some embodiments, the wafer may be static when the liquid is poured onto the surface. The spin speed is then ramped up to rotate the wafer at a high speed to spread the liquid rapidly (e.g., in about 3 seconds to about 10 seconds) over the surface to be coated (e.g., the surface to be coated 122). In the embodiments described in this disclosure, the rotational speeds selected for spreading the first liquid and the second liquid are between about 500 rpm to 2000 rpm, as explained in further detail below. When not in use, the nozzle 140 may be moved by the nozzle arm 144 to a home position in a nozzle bath containing a solvent to prevent the nozzle tips from being clogged by residue from dried liquid.

As illustrated in FIG. 1, below the wafer 120, an air knife 160 is shown blowing an air curtain at the backside 124 at a grazing angle of incidence to create a gas-flow radially outward along the backside 124 toward an annular duct 170 disposed circumferentially around the wafer 120. The construction of the example air knife 160 is understood from the cross-sectional and perspective views illustrated in FIG. 2A-2C.

The air knife 160 has been positioned proximate the backside 124 and adjusted for the air curtain to be blown through a slot 162 at a desired grazing angle of incidence toward the backside 124. The position of the slot 162 and the grazing angle of incidence, $\theta$, of the air curtain are described in further detail below with reference to FIG. 2C. The air curtain is generated by blowing gas through a gas inlet 164 into a plenum 166 of the air knife 160. Prior to pouring the first liquid onto the surface to be coated 122, the air curtain is started and the nozzle holder 146 is positioned at the pouring location. The air curtain may be started by operating a gas blower (e.g., a centrifugal blower or a screw type blower) to supply gas to the gas inlet 164. After the nozzle holder 146 has been positioned at the pouring location, a supply valve in the liquid supply line 151 may be actuated to release a controlled amount of the first liquid that flows through the first nozzle 141 and pours onto the surface to be coated 122 (indicated by a vertical arrow), where it is seen as a first liquid layer 153 in FIG. 1.

After pouring the liquid, the spin speed is ramped up to about 500 rpm to 2000 rpm and, with the wafer spinning at a high rotational speed, the liquid spreads out to the edge 120a of the wafer 120 within a few seconds, as illustrated in FIG. 2A in a magnified view of a region A. Region A is indicated by a dashed rectangle in FIG. 1. Generally, the wafer 120 is beveled near the circumferential edge; the edge 120a refers to the bevel edge. As mentioned above, because of centrifugal forces, some of the excess liquid may be ejected off the edge 120a as droplets and carried by the gas-flow (indicated by arrows in FIGS. 1, 2A, 2B, and 2C) near the edge 120a into the duct 170. The duct 170 has a top rim 170a and a bottom rim 170b above and below the wafer 120, respectively. The top rim 170a and the bottom rim 170b have been designed to guide the gas-flow near the edge 120a and position the duct 170 such that most of the solid and liquid particles ejected off the wafer 120 during spinning is captured.

The gas-flow near the edge 120a is directed into the annular duct 170 from both sides of the wafer 120. A suction pump 180, coupled to the duct 170, may be operated to create a suction region 174 in the duct 170, as illustrated in FIG. 1. When operated, the suction pump reduces the pressure in the suction region 174 to below atmospheric pressure. The suction region 174 may guide a gas-flow from above the wafer 120 near the edge 120a into the duct 170. Below the wafer 120, the air knife 160 creates a radially outward gas-flow along the backside 124 toward the annular duct 170. The gas-flow below the wafer 120 results from the air curtain blown through the slot 162 onto the backside 124. The gas-flow carrying the dislodged particles and droplets from all sides of the wafer 120 gets sucked into a wind tunnel created in the low-pressure suction region 174 by the suction pump 180. In the example embodiment, the wind tunnel in the suction region 174 is about 5 mm wide, as indicated by a dashed double arrow in FIG. 2A. In various embodiments, the wind tunnel may be about 4 mm to about 10 mm wide. In some embodiments, additional blowers and exhausts may be installed in a ceiling and floor, respectively, of the box housing the spin-coater 100 to create a downward gas flow to improve a collection efficiency of the duct 170.

Referring now to FIG. 2C, in various embodiments, the top rim 170a extends radially around the peripheral sides of the wafer 120 and is spaced from the wafer 120 by a radial distance of about 4 mm to 10 mm, with a topmost edge of the top rim 170a being vertically above the surface to be coated 122 by about 4 mm to 10 mm. In the example spin-coater 100, the topmost edge of the top rim 170a is located beyond the edge 120a by about 5 mm and vertically above the top surface (i.e., the surface to be coated 122) by about 5 mm, as illustrated by dashed double arrows in FIG. 2C.

The bottom rim 170b of the duct 170 is bent to follow a contour of a surface comprising the curved periphery and the planar backside 124 of the wafer 120 near its bevel edge 120a. Bending the lower rim 170b in this manner helps to direct the gas-flow from the air knife to follow the curved surface near the edge 120a as indicated with arrows in FIGS. 1, 2A, and 2C. A clearance of about 1.5 times to about 2 times the vertical distance between the slot 162 of the air knife and the backside 124 is maintained between the wafer 120 and the bottom rim 170b. A clearance of about 2 mm is seen in the example illustrated in FIG. 2C. In this example, the center of the slot 162 is vertically positioned to be 1 mm below the backside 124 of the wafer 120. In some embodiments, the vertical position of the slot 162 may be adjusted to be between about 0.4 mm to 1.5 mm below the backside 124 in steps of 0.05 mm to 0.1 mm. In some other embodiments the vertical distance of the slot 162 is a fixed value between about 0.4 mm to 1.5 mm below the backside 124.

In some embodiments, the bottom rim 170b may be roughly aligned to the bevel edge 120a of the wafer. In some other embodiments, the bottom rim 170b may extend further radially inward from the edge 120a up to about one half of the distance to the slot 162. For example, in spin-coater 100 illustrated in FIG. 2C, the bottom rim 170b extends by about 2 mm from the bevel edge 120a toward a center of the slot 162, which is positioned radially inward by another 5 mm from the edge 120a. In various embodiments, the air knife 160 may be positioned to place the slot 162 at a radial distance that is between about 4 mm to 10 mm from the edge 120a of the wafer 120 toward the center.

The annular duct 170 includes an annular cup 172, as illustrated in FIG. 1. The construction of the cup 172 (not shown in detail) is such that droplets and particles carried by the gas-flow entering the duct 170 are captured inside the cup 172. The captured material may be removed through a drain port. In some embodiment, the incoming gas may be steered through a zigzag passage inside the duct 170 to trap the liquid and solid material in a drain sump. The sump may be discharged periodically through a drain port, whereas the gas is discharged continuously through an exhaust system.

In FIG. 2A, the first liquid layer 153 has formed substantially uniformly on the surface to be coated 122 by centrifugal forces resulting from the spinning operation. As illustrated in FIG. 2A, the first liquid layer 153 remains confined to the top side of the wafer 120. The gas-flow generated by the air knife 160 prevents the first liquid from flowing down the sides and encroaching onto the backside 124 of the wafer 120. The cross-sectional views of the spin-coater 100 illustrated in FIGS. 1, 2A and 2C are views in the X-Z plane.

Figure 2B:
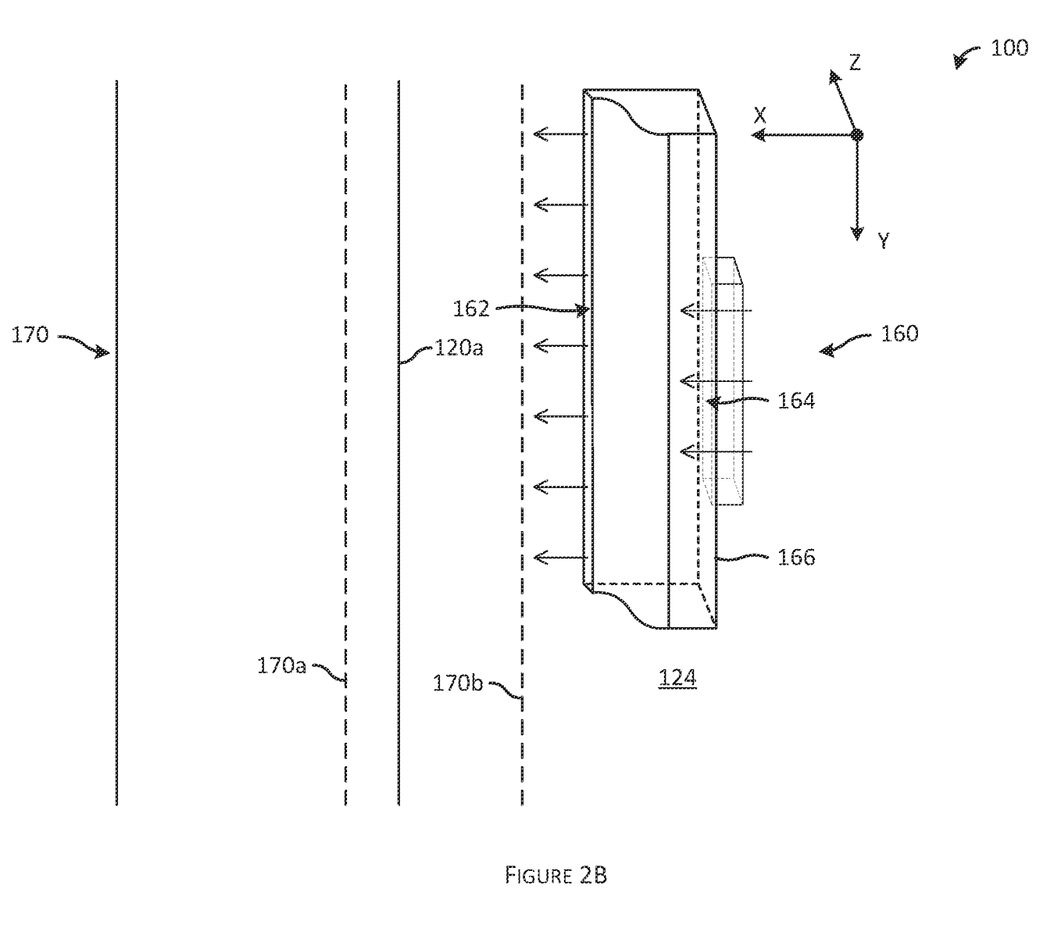
FIG. 2B illustrates a perspective view of an air knife, in accordance with some embodiment.
Figure 2C:
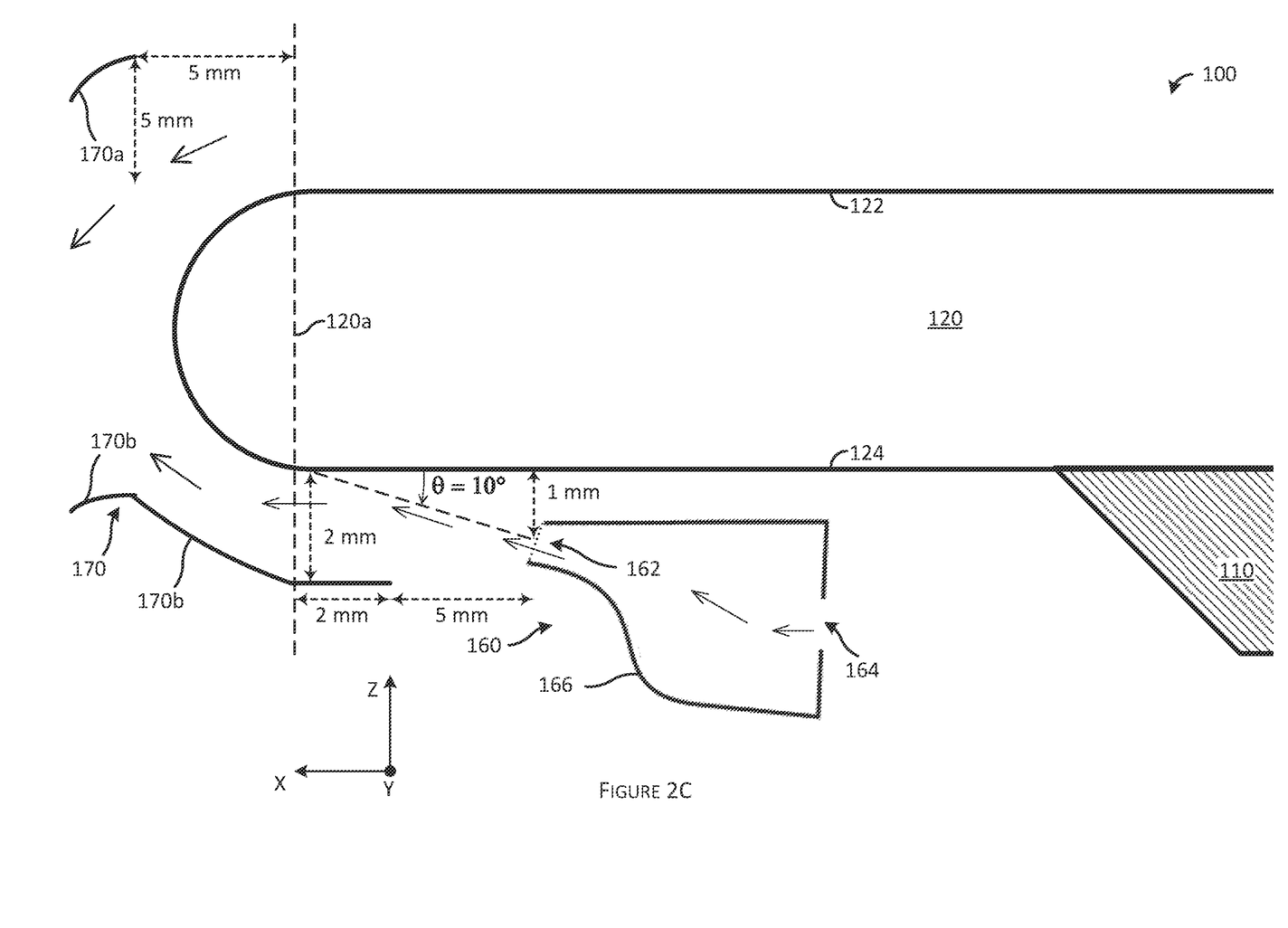
FIG. 2C illustrates a magnified view of the equipment illustrated in FIG. 1.
Figure 2D:
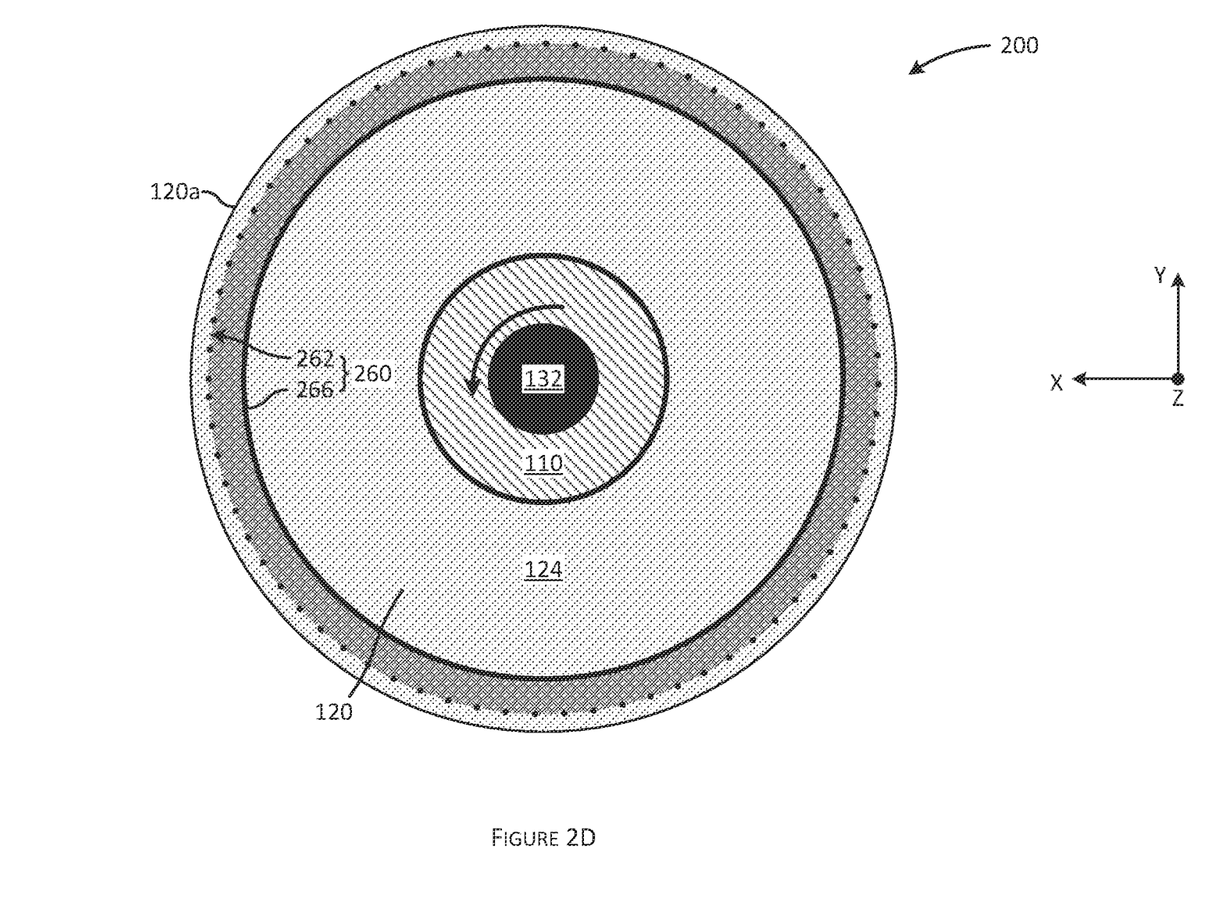
FIG. 2D illustrates a planar view of equipment for coating a wafer, in accordance with some embodiment.

FIG. 2B illustrates a perspective view of the example air knife 160, where the backside 124 is visible in the X-Y plane.

Referring now to FIG. 2B, the air knife 160 is operated to create a powerful, continuous gas stream (the air curtain) capable of shearing liquid away from the backside 124 and the curved surface near the bevel edge 120a of the wafer 120. The substantially planar backside 124 is in the X-Y plane in FIG. 2B. The contour of the curved surface near the edge 120a is clearly visible in the cross-sectional views of the X-Z plane in FIGS. 1, 2A and 2C.

Usually, an air knife is an aluminum, steel, or plastic structure housing a plenum chamber. A plenum chamber (or, simply plenum) is a pressurized container for gas at a positive pressure. The plenum of an air knife has a narrow side that looks like a thin knife edge, a shape formed from two blades joined to have the appearance of a "knife-edge". The two blades are typically two opposite sides of the plenum. The spacing between the two blades of the knife is referred to here as the plenum width. In FIGS. 2A-2C, the spacing is in the vertical direction, which is the Z-direction. Generally, the plenum width narrows down smoothly toward the knife edge. Along its knife-edge, each air knife has a long continuous slot (or multiple slots) having a slot-width that is about the same as the plenum width. The air curtain is achieved when pressurized gas in the plenum exits through the slot(s) along the knife-edge. Typically, a plenum pressure and slot-width may be adjusted to modify the gas speed and gas flow rate in the air curtain as it exits the air knife. The blades forming the knife edge are often shaped as smooth curves in order to avoid turbulence in the path of the gas-flow in the plenum. Depending on the shape of the curves, the plenums may be diversely shaped prisms, for example, chevron shaped, circular, tear-drop shaped, or asymmetrically shaped.

The example air knife 160, illustrated in FIGS. 2A-2C, has an asymmetric shape that is suitable for creating a radially flowing air curtain along the planar backside 124 toward the wafer edge 120a and into the duct 170. The plenum 166 is shaped to be wide on the side with the gas inlet 164 and narrows progressively down toward the side with the slot 162. The top of the plenum 166 (the side facing the backside 124 of the wafer 120) is flat, and the bottom of the plenum 166 curves smoothly upward to form a knife edge having a continuous slot 162 along the Y-direction, as illustrated in FIG. 2B.

As illustrated in the perspective view in FIG. 2B, the plenum 166 of the example air knife 160 has a longitudinal axis oriented along the Y-direction. A continuous slot 162 in the side of the plenum 166 facing the edge 120a runs parallel to the longitudinal axis. A gas inlet 164 is situated in the opposite side. Several horizontal arrows entering the plenum 166 indicate an incoming gas-flow from the gas blower (not shown) coupled to the gas inlet 164. Except for a pressure gradient that pushes the gas away from the gas inlet 164 toward the slot 162, the use of a plenum, such as plenum 166, helps maintain a gas pressure that is roughly uniform inside the air knife 160. The gas in the plenum 166 exits through the continuous slot 162 creating an air curtain with a high gas speed directed at the backside 124 at a grazing angle of incidence to flow substantially radially outward. The grazing angle of incidence, θ, is illustrated in FIG. 2C. The air curtain is indicated in FIG. 2B by a columnar array of arrows pointing in the X-direction.

The magnified cross-sectional view, illustrated in FIG. 2C, shows a typical position of the slot 162 of the air knife 160 relative to the backside 124 and bevel edge 120a of the wafer 120. The air curtain exiting the slot 162 flows toward the backside 124 along a direction indicated by a dashed line in FIG. 2C. The dashed line intersects the substantially horizontal portion of the backside 124 at the grazing angle of incidence, θ. In the example embodiment illustrated in FIG. 2C, θ=10°. The grazing angle of incidence, θ, is determined for each spin coating process during process development and set to the selected angle during manufacturing. Excessive tilt may reduce the radial component of gas velocity and, furthermore, exert an upward force that may wrench the wafer 120 off the wafer holder 110. Thus, in various embodiments, the grazing angle of incidence, θ, is selected to be less than or equal to 30° and greater than or equal to 0°. In some embodiments, the plenum 166 may be tilted to adjust the grazing angle of incidence, θ. In some other embodiments, the slot 162 may be constructed for the gas to exit at the desired grazing angle of incidence, θ.

In order to effectively constrain the liquid coating (e.g., the first liquid layer 153 in FIG. 2A) to the top side, it is desired that the gas-flow initiated at the slot 162 of the air knife be directed along the contour of the backside 124 with sufficient force and momentum to shear off encroaching liquid away from the edge 120a into the duct 170. Accordingly, a suitable gas speed and flow rate for the air curtain may be determined during process development by a design of experiments using slot-width and plenum pressure as factors. The selected gas speed and flow rate for the respective process may be achieved and controlled during manufacturing by adjusting the slot-width of the slot 162 and the plenum pressure in the plenum 166. The plenum pressure in the air knife 160 may be adjusted and controlled by adjusting an appropriate setting for the gas blower (e.g., the power supplied to the blower). In various embodiments, the selected gas speed may be between about 20 m/s and 100 m/s, and the plenum pressure may be selected to be at a positive pressure of about 5 kPa to about 15 kPa. In various embodiments, the selected slot-width may be from about 0.1 mm to about 1 mm.

Excessive rotational speed of the wafer 120 may cause undesired turbulence in the gas-flow along the both the top side (i.e., the surface to be coated 122) and the backside 124. Thus, the speed at which the wafer 120 is spun in order to spread the liquid from the central region to the edge region of the wafer 120 is controlled not to exceed 2000 rpm. In various embodiments, the rotational speed is selected to be between about 500 rpm to 2000 rpm.

The example spin-coater 100 uses two air knives placed roughly at diametrically opposite locations near the edge 120a of the wafer 120, as illustrated in FIG. 1. In some other embodiment, some other number of air knives may be used, each air knife positioned to blow a respective air curtain radially outwards at a different azimuthal angular location around the edge region of the wafer 120.

It is understood that a person skilled in the art may utilize the description of the example embodiment of spin-coater 100 to define other embodiments of spin-coating equipment comprising an air knife, the other embodiments having other configurations and air knife designs.

FIG. 2D illustrates a planar view of another embodiment of a spin-coater 200 using an air knife 260 having a plenum 266 shaped like a ring. In FIG. 2D, the ring-shaped air knife 260 is positioned concentric with the wafer 120 below the backside 124. The knife edge of the plenum 266 is the side facing the wafer edge 120a. A plurality of slots 262 are located circumferentially along the knife edge of the plenum 266. The length of each slot 262 may be about 2 mm to about 5 mm and a length of the knife edge between adjacent slots 262 may be 0.5 mm to 1 mm. Gas from the gas blower may be introduced into the plenum through openings disposed in the side of the plenum 266 opposite the slots 262 and the knife edge, similar to the gas inlet 164 of the plenum 166 described with reference to FIG. 2B. The openings for the gas inlet for the plenum 266 are not visible in a planar view of the X-Y plane illustrated in FIG. 2D. In addition to the wafer 120 and the air knife 260, the planar view of the spin-coater 200 in FIG. 2D shows the wafer holder 110 and the drive shaft 132, described above with reference to FIG. 1. The air duct and other components may be similar to the respective components of spin-coater 100 described above with reference to FIG. 1 and FIGS. 2A-2C.

If the air knife 160 were not included in the spin coater (e.g., the spin-coater 300 illustrated in FIG. 3) then the liquid coating would encroach down the edge 120a onto the backside 124, as seen for the liquid layer 353 in FIG. 3. Such an encroachment poses a risk of contamination and defects during subsequent processing. For example, the liquid layer 353 may comprise a metal-based photoresist, and any resist residue on the backside after a resist strip step may be a source of undesired particles or metal contamination during subsequent processing.

FIG. 4 illustrates a flow diagram of a method 400 for coating a wafer (e.g., wafer 120 in FIG. 1) with a liquid coating on a surface to be coated. The method uses a spin-coater, similar to the spin-coater 100 described above with reference to FIG. 1 and FIGS. 2A-2C. The method 400 is an example embodiment where the liquid coating is a composite of two liquids, a first liquid and a second liquid. The first liquid may be, for example, a resist solvent used to wet the surface to be coated (e.g., the surface to be coated 122 in FIG. 1) and the second liquid may be the resist. Forming a first liquid coating with the resist solvent helps to form a second liquid coating that includes the resist. Having the solvent coated on the surface to be coated decreases the contact angle between the resist and the interfacial surface adjacent below the resist. The reduced contact angle helps the resist to spread more easily across the wafer.

As indicated in box 410 of the flow diagram, the method 400 comprises holding a wafer with a rotatable wafer holder, where the wafer is held such that an edge region is exposed, similar to the wafer 120 being held by the wafer holder 110 in FIG. 1.

As indicated in box 412 of the flow diagram in FIG. 4, the method 400 includes positioning a slot of an air knife (e.g., the slot 162 of the air knife 160 described above with reference to FIGS. 2A-2C). The positioning includes positioning the slot vertically below the backside (the backside being opposite the surface to be coated) and laterally at a radial location between the center and the edge, in the exposed edge region. The slot is located in close proximity to both the backside and the edge of the wafer, as described above with reference to FIGS. 2A-2C. In addition, the air knife may be configured to direct the air curtain toward the backside at a selected grazing angle of incidence, θ, as described above with reference to FIG. 2C.

During process development, the direction, speed and flow rate of gas in the air curtain are selected for effective containment of the liquid coating to the surface to be coated (e.g., the surface to be coated 122 in FIG. 2A). As explained above, the factors that may be adjusted to adjust the air curtain include the grazing angle of incidence, θ, the slot-width, and the plenum pressure. Accordingly, before starting blowing the air curtain, the air knife and the blower are configured to adjust the air curtain to achieve the selected values of the direction, speed and flow rate of gas in the air curtain for a specific process. Adjusting the grazing angle of incidence, θ, is indicated in box 414 of the flow diagram of the method 400, adjusting the slot-width is indicated in box 416, and adjusting the plenum pressure is indicated in box 418 in FIG. 4.

Blowing the air curtain through the slot of the air knife is indicated in box 420. As shown in the flow diagram of the method 400 in FIG. 4, the air curtain is started prior to pouring liquid on the surface to be coated. The air curtain may be started by operating a gas blower to blow gas into a plenum of the air knife through a gas inlet of the plenum. The air curtain exiting through the slot reaches the backside of the wafer at a grazing angle of incidence, θ, thereby creating a radially outward gas-flow away from the wafer.

The steps in the method 400 for forming the liquid coating on the surface to be coated are listed in boxes 422, 424, and 426. In the example method 400, the liquid coating being formed is a composite liquid coating comprising two liquids, for example, a resist solvent and a resist, as mentioned above. Hence, forming the liquid coating comprises forming a first liquid coating and, after forming the first liquid coating, forming a second liquid coating, the second liquid coating being the composite liquid coating. In forming the liquid coating, a nozzle (e.g., nozzle 140 in FIG. 1) is positioned above a central region of the surface to be coated (box 422). In this example, the nozzle comprises two individual nozzles, a first nozzle and a second nozzle. A controlled amount of first liquid (e.g., a resist solvent) is poured through the first nozzle onto the central region of the surface to be coated (box 424). In the method 400, spinning the wafer holder holding the wafer is initiated prior to pouring the first liquid. Thus, in this example, the wafer is spinning, typically, at a low rotational speed during the pouring. In some other embodiment, liquid may be poured on a static wafer. The first liquid that is poured onto the wafer is spread across the wafer by ramping up the spinning to a selected high rotational speed, as described above. Spreading the first liquid by spinning the wafer at the selected rotational speed is indicated in box 426. With the wafer spinning at the high rotational speed, the first liquid coating is formed within a few seconds. It is noted that the air curtain is continuously blowing while the liquid is being poured and spread across the wafer by spinning.

The method 400 includes collecting excess liquid and solid particles dislodged by centrifugal forces and the gas blown from the air knife positioned below the wafer near its edge. The liquid and solid ejected off the wafer are collected in a duct (e.g. the duct 170 in FIG. 1) positioned circumferentially around the edge of the wafer. The collecting of ejected material off the wafer edge may include operating a suction pump coupled to the annular duct, wherein operating the suction pump guides a gas-flow at the edge of the wafer into the duct. Collecting the ejected material into the circumferential duct is indicated in box 428.

In this example spin-coating process, after forming the first liquid coating, the method further includes forming the second liquid coating (box 430) using steps similar to the steps for forming the first liquid coating. Forming the second liquid coating (which is the final composite liquid coating) comprises positioning the nozzle and pouring a second liquid (e.g., resist) from the second individual nozzle onto the central region of the first liquid coating, while spinning the wafer. The spinning wafer spreads the second liquid across the wafer to form the second liquid coating on the surface to be coated. As before, excess liquid and dislodged solid particles are collected in the duct that is positioned circumferentially surrounding the wafer.

After the liquid coating (e.g., the liquid coating comprising the resist solvent and the resist) has been formed, the method 400 may be performing a dry-spin step. Dry-spin is a centrifugal drying process where the wafer is spun at a very high rotational speed, typically higher than the rotational speed with which the wafer is spun to spread liquid to form a liquid coating. The dry-spin may be performed without blowing the air curtain. Hence, the method 400 may include terminating blowing the air curtain once forming the final liquid coating has been completed.

FIG. 5 illustrates a block diagram of a of a lithography system 600. Typically, a lithography system in a mass production environment comprises a projection scanner 620 and a track system 610.

The scanner 620 is a combination of an optical and mechanical system to scan an optical image of a pattern printed on a photomask onto the surface of a wafer coated with resist. After scanning the pattern once, the scanner is operated to step to an adjacent location on the same wafer where the scan is repeated to form another copy of the pattern. In this manner, the resist layer is exposed to multiple copies of the pattern arranged in a rectangular matrix on the surface of the wafer.

The track system 610 comprises a series of process modules assembled to allow sequential execution of processes that may be needed for the lithography process prior to the exposure and after the exposure step performed by the scanner 620. The track system 610 provides the material processes such as coating the wafer with resist, baking the resist, and developing the resist after exposure. The process modules of the track system 610, as shown in the block diagram in FIG. 5, includes a spin-coating module 601, a pre-exposure bake module 603, a post-exposure bake module 604, and a developing module 605 for developing the exposed resist. The spin-coating module 601 comprises a spin-coater with air knives, such as the spin-coater 100, described above with reference to FIG. 1, and FIGS. 2A-2C. Resists and solvents are connected from a liquid supply system (e.g., the liquid supply system 150 in FIG. 1) to each process module (e.g., the spin-coating module 60i) via pipelines, filters, valves, and pumps.

In addition to process modules, the track system 610 includes an imaging module 602 and an inspection and metrology module 606.

The inspection and metrology module 606 receives wafers after a resist layer has been exposed to a pattern of actinic radiation in the scanner 620, and the pattern has been transferred to the resist in the developing module 605, where the exposed resist is developed to form a patterned resist layer. The quality of the resist pattern is evaluated by inspecting and measuring various images of the resist pattern in the inspection and metrology module 606. Thus, the inspection and metrology module 606 may include, for example, a scanning electron microscope (SEM) for measuring critical dimensions in the resist pattern. Wafers may fail inspection because of patterning defects or if the measurements are not within specified limits. Failed wafers may be discarded, or, in some instances, reworked by stripping the resist and repeating the resist patterning process steps.

The optical imaging module 602 in the track system 610 may be used to identify defects prior to exposing the resist to a radiation pattern in the scanner 620. Wafers coated with resist are received from the spin-coating module 601 and imaged in the optical imaging module 602 using an imaging system comprising light sources and cameras. The light sources are configured to illuminate the wafer, while the cameras create photographic images of the surfaces. In some embodiments, the imaging system of the optical imaging module 602 includes a plurality of cameras to image the wafer from various directions. For example, in one embodiment, separate cameras are used to image the wafer from the top, bottom, and side. The camera on the top images the side coated with resist, the bottom camera images the backside, and the camera at the side images the beveled edges of the wafer. The cameras may be coupled to a controller of the imaging system that acquires and transmits the images to an inspection device for image analysis. The inspection device may identify defects using, for example, a processor of the inspection device configured to execute instructions stored in an electronic memory of the inspection device to perform appropriate image analysis. Many metal based resist (MBR) and organic resist compositions exhibit fluorescence when exposed to ultraviolet (UV) light. This property may be utilized to evaluate the effectiveness of the air curtain in constraining the resist coating to the top side of the wafer by illuminating the backside and the beveled edges of the wafer with UV light and inspecting the respective optical image for presence of fluorescing resist residue. Hence, in some embodiments, the optical imaging module 602 may include an UV light source to detect presence of resist encroachment or residue on the backside. The wavelength of the UV light from the UV light source may be in the range of about 300 nm to about 400 nm to avoid photochemical reactions in the resist layer. If the air curtain from the air knife had failed to suppress resist from encroaching onto the backside then the defect may be detected from an UV image of the backside. The defective wafer may be reworked or scrapped, as needed.

Example 1. Equipment for coating a wafer, where the equipment includes a wafer holder configured to spin the wafer while holding the wafer, a rotary drive configured to spin the wafer holder, a nozzle configured to pour liquid onto a surface to be coated of the wafer; an annular duct disposed circumferentially around the wafer when the wafer is spun by the wafer holder, the duct configured to collect material ejected off an edge of the wafer; and an air knife disposed proximate a backside, the backside being opposite the side to be coated, where the air knife is configured to blow an air curtain through a slot onto an exposed edge region of the backside at a grazing angle of incidence to flow gas radially outward along the backside toward the annular duct.

Example 2. The equipment of example 1, where the air knife is configured to adjust the grazing angle of incidence to a selected angle, where the selected angle is greater than or equal to 0° and less than or equal to 30°.

Example 3. The equipment of one of examples 1 or 2, where the air knife includes a plenum having a gas inlet for gas to enter and the slot for the air curtain to exit, where a pressure of gas in the plenum is adjustable, the pressure being a positive pressure greater than or equal to 5 kPa and less than or equal to 15 kPa.

Example 4. The equipment of one of examples 1 to 3, where the air knife is positioned to place the slot at a vertical distance that is between 0.4 mm to 1.5 mm below the backside and a radial distance that is between 4 mm to 10 mm from the edge toward the center.

Example 5. The equipment of one of examples 1 to 4, where the duct is configured to guide the radially outward gas-flow near the edge region into the duct, where a rim of the duct is bent to follow a contour of the wafer surface while maintaining a clearance from the wafer and extending radially inward from the edge toward the slot.

Example 6. The equipment of one of examples 1 to 5, further including a plurality of air knives, each air knife of the plurality of air knives positioned to blow a respective air curtain radially outwards at a different azimuthal angular location around the edge region of the wafer.

Example 7. The equipment of one of examples 1 to 6, where the air knife includes a plenum shaped like a ring, the plenum being positioned concentric with the wafer.

Example 8. The equipment of one of examples 1 to 7, further including a suction pump coupled to the annular duct, the pump configured to form a suction region in the duct that guides a gas-flow near the edge of the wafer into the duct.

Example 9. The equipment of one of examples 1 to 8, where the nozzle includes a first nozzle and a second nozzle, the first nozzle configured to pour a first liquid and the second nozzle configured to pour a second liquid.

Example 10. A method for coating a wafer, where the method includes holding a wafer with a rotatable wafer holder, the wafer having an exposed edge region; through a slot of an air knife, blowing an air curtain onto a backside of the wafer at a grazing angle of incidence to create a radially outward gas-flow away from the wafer, the backside being opposite a surface to be coated; forming a liquid coating on the surface to be coated, the forming including: positioning a nozzle above a central region of the surface to be coated; pouring a liquid from the nozzle onto the surface to be coated; spinning the wafer held by the wafer holder while blowing the air curtain, the air curtain blocking the liquid from encroaching onto the backside; and collecting material ejected off the edge of the wafer in an annular duct disposed circumferentially around the edge, the material including liquid and solid particles dislodged by the spinning and the gas-flow.

Example 11. The method of example 10, further including, after forming the liquid coating is complete, performing a dry-spin, the dry-spin being a centrifugal drying process including spinning the wafer held by the wafer holder and terminating blowing the air curtain.

Example 12. The method of one of examples 10 or 11, further including, prior to blowing the air curtain through the slot, adjusting the grazing angle of incidence to a selected angle, where the selected angle is greater than or equal to 0 (and less than or equal to 30(.

Example 13. The method of one of examples 10 to 12, further including: operating a gas blower to blow gas into a plenum of the air knife through a gas inlet of the plenum; and adjusting a plenum pressure and/or adjusting a width of the slot to blow the air curtain at a selected gas speed and gas flow rate.

Example 14. The method of one of examples 10 to 13, where, the nozzle includes a first nozzle and a second nozzle, and where forming the liquid coating includes forming a first liquid coating and, after forming the first liquid coating, forming a second liquid coating, where the first liquid coating includes a first liquid poured from the first nozzle, and where the second liquid coating includes a second liquid, the second liquid being poured from the second nozzle onto the first liquid coating.

Example 15. The method of one of examples 10 to 14, where the second liquid is a resist and the first liquid is a solvent for the resist.

Example 16. The method of one of examples 10 to 15, where collecting material ejected off the edge of the wafer includes operating a suction pump coupled to the annular duct, where operating the suction pump guides a gas-flow at the edge of the wafer into the duct.

Example 17. A track system including: a wafer coater module including: a wafer holder configured to spin a wafer held such that a surface to be coated and an edge region of a backside are exposed, the backside being opposite the surface to be coated; a rotary drive configured to spin the wafer holder about a central axis normal to the wafer, where spinning the wafer holder spins the wafer held by the wafer holder; a nozzle configured to be positioned above the surface to be coated and pour liquid onto the surface to be coated; an air knife including a plenum having a gas inlet coupled to a gas blower and a slot for an air curtain to exit, the air knife configured to position the slot proximate the backside and tilted to direct the air curtain toward the backside at a grazing angle of incidence to create a gas-flow radially outward along the exposed backside; and an annular duct disposed to be circumferentially around the wafer when spun by the wafer holder, the duct being configured to collect liquid and solid particles dislodged by the spinning and the gas-flow and ejected off an edge of the wafer, and a light source and a camera coupled to a controller to acquire and transmit photographic images of the surfaces of the wafer to an inspection device.

Example 18. The track system of example 17, where the camera includes a first camera configured to image the surface at the backside of the wafer, a second camera configured to image the surface opposite the backside of the wafer, and a third camera configured to image the surface at the sedge of the wafer.

Example 19. The track system of one of examples 17 or 18, where the light source includes an ultraviolet (UV) light source.

Example 20. The track system of one of examples 17 to 19, where the wavelength of UV light from the UV light source is greater than or equal to 300 nm and less than or equal to 400 nm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. Equipment for coating a wafer, the equipment comprising:
   a wafer holder configured to spin the wafer while holding the wafer;
   a rotary drive configured to spin the wafer holder;
   a nozzle configured to pour liquid onto a surface of the wafer to be coated at a front side of the wafer;
   an annular duct disposed circumferentially around the wafer when the wafer is spun by the wafer holder, the duct configured to collect material ejected off an edge of the wafer; and
   an air knife disposed proximate a backside of the wafer, the backside being opposite the front side, wherein the air knife is configured to blow an air curtain through a slot onto an exposed edge region of the backside at a grazing angle of incidence to flow gas radially outward along the backside toward the annular duct, the grazing angle of incidence being an angle between a tangent to a major surface of the backside of the wafer and a direction of incidence of the air curtain towards the backside.

2. The equipment of claim 1, wherein the air knife is configured to adjust the grazing angle of incidence to a selected angle, wherein the selected angle is greater than or equal to 0° and less than or equal to 30°.

3. The equipment of claim 1, wherein the air knife comprises a plenum, the plenum having a gas inlet for gas to enter and the slot for the air curtain to exit, wherein a pressure of gas in the plenum is adjustable, the pressure being a positive pressure greater than or equal to 5 kPa and less than or equal to 15 kPa.

4. The equipment of claim 1, wherein the air knife is positioned to place the slot at a vertical distance that is between 0.4 mm to 1.5 mm below the backside and a radial distance that is between 4 mm to 10 mm from the edge toward the center.

5. The equipment of claim 1, wherein the duct is configured to guide the gas flowing radially outward near the edge region into the duct, wherein a rim of the duct is bent to follow a contour of the major surface of the backside of the wafer while maintaining a clearance from the wafer and extending radially inward from the edge toward the slot.

6. The equipment of claim 1, further comprising a plurality of air knives, each air knife of the plurality of air knives positioned to blow a respective air curtain radially outwards at a different azimuthal angular location around the edge region of the wafer.

7. The equipment of claim 1, wherein the air knife comprises a plenum shaped like a ring, the plenum being positioned concentric with the wafer.

8. The equipment of claim 1, further comprising a suction pump coupled to the annular duct, the pump configured to form a suction region in the duct that guides a gas-flow near the edge of the wafer into the duct.

9. The equipment of claim 1, wherein the nozzle comprises a first nozzle and a second nozzle, the first nozzle configured to pour a first liquid and the second nozzle configured to pour a second liquid.

10. A track system comprising:
a wafer coater module comprising:
    a wafer holder configured to spin a wafer held such that a surface to be coated and an edge region of a backside are exposed, the backside being opposite the surface to be coated;
    a rotary drive configured to spin the wafer holder about a central axis normal to the wafer, wherein spinning the wafer holder spins the wafer held by the wafer holder;
    a nozzle configured to be positioned above the surface to be coated and pour liquid onto the surface to be coated;
    an air knife comprising a plenum having a gas inlet coupled to a gas blower and a slot for an air curtain to exit, the air knife configured to position the slot proximate the backside and tilted to direct the air curtain toward the backside at a grazing angle of incidence to create a gas-flow radially outward along the exposed backside, the grazing angle of incidence being an angle between a tangent to a major surface of the backside of the wafer and a direction of incidence of the air curtain towards the backside; and
    an annular duct disposed to be circumferentially around the wafer when spun by the wafer holder, the duct being configured to collect liquid and solid particles dislodged by the spinning and the gas-flow and ejected off an edge of the wafer; and
    a light source and a camera coupled to a controller to acquire and transmit photographic images of the surface of the wafer to an inspection device.

11. The track system of claim 10, wherein the camera comprises a first camera configured to image the surface to be coated, a second camera configured to image a surface on the backside of the wafer, and a third camera configured to image a surface at an edge of the wafer.

12. The track system of claim 10, wherein the light source comprises an ultraviolet (UV) light source.

13. The track system of claim 12, wherein the wavelength of UV light from the UV light source is greater than or equal to 300 nm and less than or equal to 400 nm.

14. Equipment for coating a wafer, the equipment comprising:
a rotary drive configured to spin a wafer holder;
a nozzle configured to pour liquid onto a surface of the wafer to be coated at a front side of the wafer;
an annular duct disposed circumferentially around the wafer when the wafer is spun by the wafer holder, the duct configured to collect material ejected off an edge of the wafer; and
an air knife disposed proximate a backside of the wafer, the backside being opposite the front side, wherein the air knife is configured to blow an air curtain through a slot onto an exposed edge region of the backside at a grazing angle of incidence to flow gas radially outward along the backside toward the annular duct, the grazing angle of incidence being an angle between a tangent to a major surface of the backside of the wafer and a direction of incidence of the air curtain towards the backside, wherein the air knife is configured to adjust the grazing angle of incidence to a selected angle.

15. The equipment of claim 14, wherein the selected angle is greater than or equal to 0° and less than or equal to 30°.

16. The equipment of claim 14, wherein the air knife comprises a plenum, the plenum having a gas inlet for gas to enter and the slot for the air curtain to exit, wherein a pressure of gas in the plenum is adjustable, the pressure being a positive pressure greater than or equal to 5 kPa and less than or equal to 15 kPa.

17. The equipment of claim 14, wherein the air knife is positioned to place the slot at a vertical distance that is between 0.4 mm to 1.5 mm below the backside and a radial distance that is between 4 mm to 10 mm from the edge toward the center.

18. The equipment of claim 14, wherein the duct is configured to guide the gas flowing radially outward near the edge region into the duct, wherein a rim of the duct is bent to follow a contour of the major surface of the backside of the wafer while maintaining a clearance from the wafer and extending radially inward from the edge toward the slot.

19. The equipment of claim 14, wherein the air knife comprises a plenum shaped like a ring, the plenum being positioned concentric with the wafer.

20. The equipment of claim 14, further comprising a suction pump coupled to the annular duct, the pump configured to form a suction region in the duct that guides a gas-flow near the edge of the wafer into the duct.

* * * * *